United States Patent
He et al.

(10) Patent No.: US 8,719,646 B2
(45) Date of Patent: May 6, 2014

(54) NON-VOLATILE MEMORY (NVM) RESET SEQUENCE WITH BUILT-IN READ CHECK

(75) Inventors: Chen He, Austin, TX (US); Kelly K. Taylor, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 172 days.

(21) Appl. No.: 13/459,500

(22) Filed: Apr. 30, 2012

(65) Prior Publication Data

US 2013/0290797 A1    Oct. 31, 2013

(51) Int. Cl.
*G11C 29/00* (2006.01)

(52) U.S. Cl.
USPC .......................................... 714/718; 714/23

(58) Field of Classification Search
USPC ........ 365/185.28; 326/38; 370/453; 711/118; 714/763, 764, 718, 23
See application file for complete search history.

(56) References Cited

U.S. PATENT DOCUMENTS

| | | | |
|---|---|---|---|
| 6,295,230 B1 * | 9/2001 | Madurawe et al. | 365/185.28 |
| 6,763,033 B1 * | 7/2004 | Runstadler | 370/453 |
| 7,093,115 B2 | 8/2006 | Poisner et al. | |
| 7,257,667 B2 | 8/2007 | Roohparvar | |
| 7,500,056 B2 * | 3/2009 | Wheeler et al. | 711/118 |
| 7,746,699 B1 | 6/2010 | Edwards et al. | |
| 8,436,644 B2 * | 5/2013 | Watanabe et al. | 326/38 |
| 2002/0163368 A1 | 11/2002 | Cheung et al. | |
| 2011/0179322 A1 * | 7/2011 | Lee et al. | 714/719 |

* cited by examiner

*Primary Examiner* — David Ton

(57) ABSTRACT

A new, robust non-volatile memory (NVM) reset sequence is provided in accordance with at least one embodiment, which, after reading a Test NVM portion and overwriting NVM configuration registers' default values with the values read from the Test NVM portion, does a read integrity check. If the read integrity check passes, a reset process will conclude. Otherwise, if the read integrity check fails, the reset process will re-try reading the Test NVM and overwriting the NVM configuration registers' default values. If the read integrity check still fails after a maximum number of re-tries, a fail flag will be set, and the predetermined "safe" default values will be reloaded to the NVM configuration registers, thereby assuring that the NVM device is operational.

20 Claims, 2 Drawing Sheets

NON-VOLATILE MEMORY (NVM) RESET SEQUENCE WITH BUILT-IN READ CHECK

BACKGROUND OF THE INVENTION

1. Field of the Invention

This disclosure relates generally to electronic devices, and more particularly to electronic devices that include non-volatile memory.

2. Description of the Related Art

Memory devices are used to store information in electronic systems. Many different kinds of information can be stored in memory devices, including configuration information that can be used to configure the operation of the memory device itself. For example, configuration information that is stored on a part-by-part basis can be used to facilitate part-by-part trimming of operating conditions of the memory devices to ensure enhanced performance and reliability for each individual memory device.

A memory device, such as a non-volatile memory (NVM) device (e.g., a flash memory device) undergoes a transition during a reset sequence. For example, the transition can be from an idle or low-power state (e.g., being powered down, being in a sleep mode, or being reset) to an operational state. If an error occurs during such transition, it can prevent the memory device from entering the operational state or lead to errors during operation. Thus, a technique is needed to ensure that a memory device is properly initialized and safely enters the operational state.

BRIEF DESCRIPTION OF THE SEVERAL VIEWS OF THE DRAWINGS

The present disclosure may be better understood, and its features made apparent to those skilled in the art by referencing the accompanying drawings.

The use of the same reference symbols in different drawings indicates similar or identical items.

DETAILED DESCRIPTION OF THE INVENTION

Figure 1:
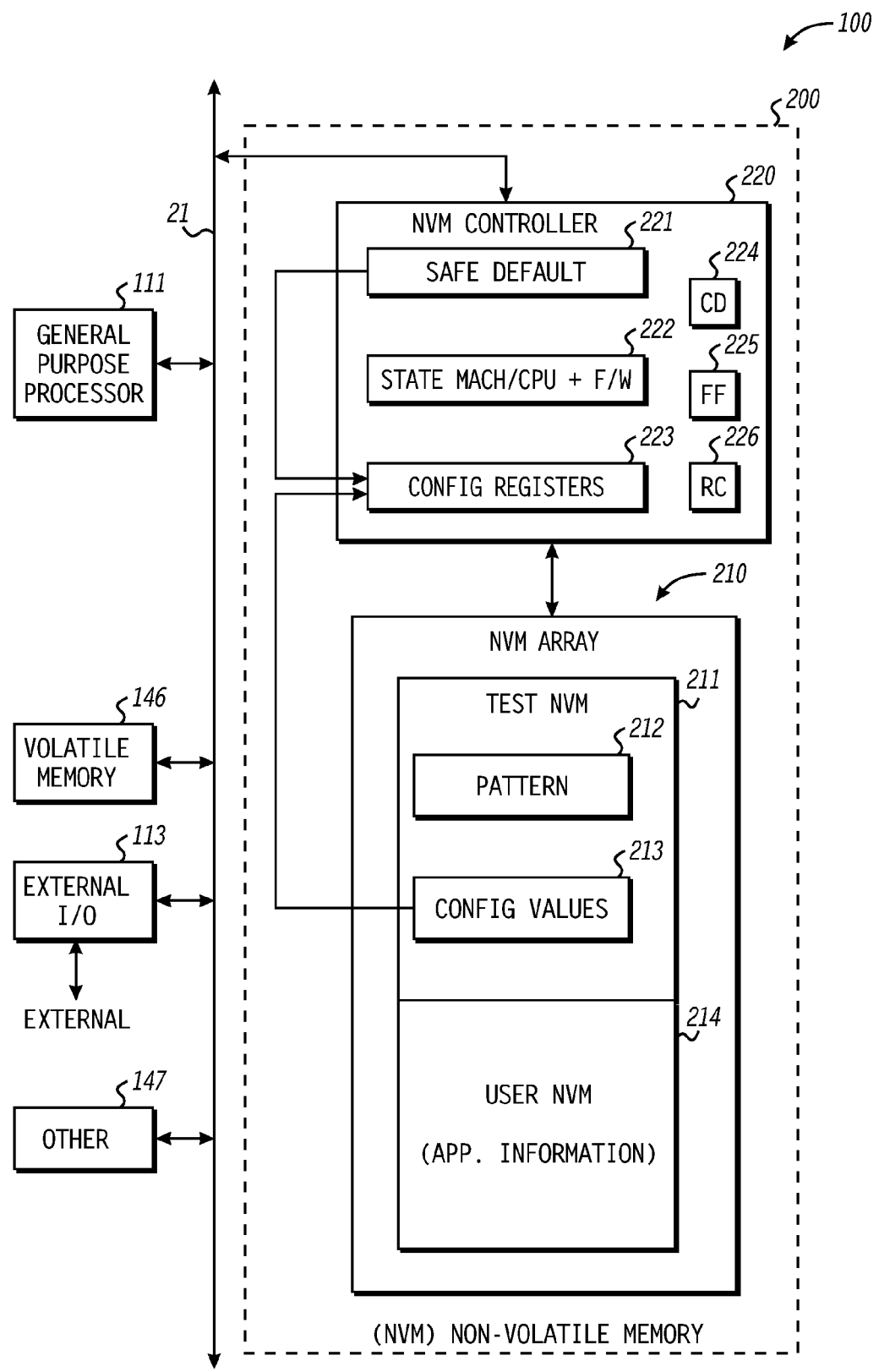
FIG. 1 illustrates, in block diagram form, an integrated circuit 100 comprising a non-volatile memory (NVM) module in accordance with at least one embodiment.

According to an embodiment, a non-volatile memory (NVM) reset sequence with built-in read check is provided. According to an embodiment, a non-volatile memory stores trim values that are used during a reset sequence to facilitate improved NVM performance and reliability. For this purpose, NVM trim values that can affect NVM operating conditions are stored in a particular NVM area (referred to as Test NVM). Such trim values can be deterministically or empirically determined and stored for each memory device in a production test flow process.

In an embodiment of an NVM reset sequence, NVM configuration registers are initially loaded with default values, referred to herein as safe values, which are conservative values for ensuring that parts will operate properly during an initialization process, albeit perhaps not at an enhanced performance levels. Then, the NVM trim values are read from the Test NVM portion of the NVM array and stored to corresponding NVM configuration registers of the NVM controller to overwrite the safe values and facilitate enhanced performance and reliability over process, voltage and temperature variations. The term "overwrite" as used herein with respect to the use of NVM trim values is intended to mean a process whereby a different value is used for an intended purpose. For example, the trim values stored at the Test NVM portion of the NVM array can be retrieved from the NVM array and stored at a register that is accessed to control operation of the NVM memory; alternatively, for example, the trim values can be stored in a different register that is selectively read to control operation of the NVM memory, or the trim values can be selectively read to control operation of the NVM memory.

However, during a NVM reset, transient operational issues may cause incorrect values to be read from the Test NVM and loaded to the NVM configuration registers, hence causing the NVM device not to work properly. As one example of such issue, a NVM clock oscillator may accidentally enter a harmonic state during a reset process or while waking up from a sleep mode. Such a harmonic state causes the NVM clock oscillator to run too fast for a short period of time, during which the NVM clock oscillator is prevented from achieving a phase locked state. While the harmonic state is generally a transient state that can be resolved within a few microseconds after which the NVM clock oscillator achieves its intended frequency, it is often the case that attempts to read the NVM trimming values from the Test NVM typically occur during the short period of time during which the harmonic state at the oscillator occurs. As a result, the information read from the Test NVM and stored at the NVM configuration registers can be indeterminate, causing the NVM to operate in a manner that can be sub-optimal or to not operate at all. Therefore, a method for ensuring reliable operation of an NVM device in accordance with at least one embodiment despite transient operational uncertainties during reset would be useful.

According to a specific embodiment of the present disclosure, an improvement in product quality and reliability can be provided by an alternate NVM reset sequence that ensures correct or safe values in case of errors occurring during reset are loaded to the NVM configuration registers subsequent to reading the Test NVM during reset. By loading the correct or safe values, subsequent to using a built-in read check that determines when the values stored at the Test NVM are considered indeterminate, ensures that the NVM exits reset in a working state allowing for an improvement to product quality and reliability. Therefore, in accordance with at least one embodiment, such a new NVM reset sequence with built-in read check is provided.

A new, more robust NVM reset sequence is provided in accordance with at least one embodiment, which, after the read to the Test NVM portion and overwriting the NVM configuration registers' default values with the values obtained during the read of the Test NVM portion, does a read integrity check. If the read integrity check passes, the reset sequence will continue. Otherwise, if the read integrity check fails, the reset sequence will perform another read to the Test NVM portion and overwrite the NVM configuration registers with the values obtained during the subsequent read of the Test NVM portion. This process continues, until the read integrity check passes, or until the read integrity check continues to fail a maximum number of re-tries, after which, a fail flag will be set, and the predetermined safe values will be reloaded to the NVM configuration registers, thereby assuring that the NVM device is operational by virtue of using the safe values.

As examples, the read integrity check can check for a particular data pattern (e.g. 0x55AA55AA) at a reserved Test NVM location, can check for a checksum of a reserved area in Test NVM, or can check for non-correctable error correcting code (ECC) error, if the NVM contains ECC logic circuits, during the reads. The reserved Test NVM location/area will be programmed during a production test process. The new NVM reset sequence can be implemented, for example, by either a hardware state machine or firmware. As an example, the firmware may be run by a memory management-specific processor, such as a NVM controller.

In accordance with at least one embodiment, a first reserved Test NVM location/area is provided for the storage of NVM trim values, which are programmed during a production test process during production of the NVM device, and a second reserved Test NVM location/area is provided for the storage of read integrity check information such as a particular data pattern, which is information independently ascertainable by the NVM controller, which may be read and verified to perform a read integrity check. Before the Test NVM is programmed for a first time on a memory device still undergoing the production process, e.g., prior to the first reserved Test NVM locations/area having been programmed, the reset sequence of the memory device will ensure the safe default values are loaded to NVM configuration registers to ensure initial, low performance, operation. Thus, an operational state of the NVM device can be obtained earlier and more conveniently in the production process, and the NVM controller can be simplified, as the NVM controller's NVM reset sequence can be used for NVM arrays with blank Test NVM locations/areas as well as for NVM arrays that have appropriate values stored in their Test NVM locations/areas.

At least one embodiment ensures correct or safe values to be loaded to NVM configuration registers even if there is some type of glitch when reading Test NVM during a NVM reset sequence, so that NVM can always be reset to a working state no matter how many transient read faults may have occurred during the NVM reset sequence.

In accordance with at least one embodiment, the safe default values are known with certainty to a control apparatus (for example, a NVM controller), while the enhanced configuration values are not known a priori with certainty to the control apparatus but have to be obtained from another element (for example, from the Test NVM area of the NVM array). While the process of the control apparatus obtaining the enhanced configuration values from the other element ideally occurs reliably, an error occurring in the process could corrupt the enhanced configuration values and render data in the NVM array inaccessible and/or make the reading of it (and/or writing of it) unreliable (but for the assured manner in which the safe default values are loaded, in accordance with at least one embodiment). As an example, the safe default values may be stored as data that are fixed by metallization that is directly latched into the NVM configuration registers at start-up and/or upon repeated failure of a Test NVM read integrity check. Therefore, loading of the safe default values can occur independent of variables that may affect the ability to load data from the NVM array (for example, enhanced configuration values from the Test NVM area of the NVM array). Thus, the safe default values are unconditionally known with certainty to the control apparatus and their loading is assured (even when the loading of the enhanced configuration values is not assured).

FIG. 1 illustrates, in block diagram form, an integrated circuit 100 comprising a non-volatile memory (NVM) module 200 in accordance with at least one embodiment. In the illustrated embodiment, integrated circuit (IC) 100 includes one or more processors 111, an external Input/Output (IO) module 113, one or more NVM devices, e.g., NVM modules 200, one or more other volatile memories 146, one or more other modules 147, which are connected via an appropriate interface 21, such as a bus or the like, with multiple signals or bits. Alternate embodiments may not have a processor 111, may not have other memory 146, may not have other modules 147, and/or may not have external IO module 113. Conversely, at least one embodiment may have additional modules. For purposes of discussion, it is presumed that the processor 111 is a general purpose processor that can fetch and execute instructions and data from either the volatile memory module 146 or from the NVM 200.

External IO 113 is connected to an external interface (EXTERNAL) through which information can be communicated between the IC 100 and an external device. A particular embodiment of NVM module 200 is illustrated in FIG. 1. In the specific embodiment illustrated, the NVM module 200 is illustrated to have an NVM controller module 220 and an NVM array module 210. According to the specific embodiment illustrated, the NVM array module 210 includes a Test NVM portion 211, where testing and configuration information may be stored, and a user NVM portion 214, where user data, such as application information, may be stored. Test NVM portion 211 comprises pattern storage 212, where Test NVM read integrity check information such as a particular data pattern may be stored, and configuration value storage 213, where NVM configuration information, such as enhanced NVM configuration values, may be stored. Test NVM is usually not accessible in normal user mode, to avoid accidental disturbance of the testing and configuration information stored there.

NVM controller module 220 is connected to and controls access to NVM array module 210. NVM controller module 220 comprises safe default configuration value storage 221, state machine or processor (e.g., central processing unit (CPU)) and firmware (F/W) 222, NVM configuration registers 223, Test NVM read integrity check data (CD) storage 224 which stores the information of expected data (such as the pattern code or checksum) for the read integrity check, fail flag (FF) storage 225, and number of retries (RC) storage 226. NVM controller module 220 is connected to bus interface 21 and may communicate with other modules connected to bus interface 21, such as processor(s) 111. Under the control of the NVM controller 220, data is written into, e.g., for programming, or read from the NVM array module 210. An NVM reset sequence is also typically controlled by the NVM controller 220. The NVM array module 210 may be implemented as a number of memory blocks, including: a set of programmable and erasable blocks for normal usage, namely user NVM portion 214, and a special reserved set of at least one block, namely Test NVM portion 211. The Test NVM portion 211 may comprise at least one programmable and erasable block and/or at least one one-time-programmable (OTP) block.

According to the embodiment described herein, access requests that are processed by NVM controller module 220 are used to provide lower-level access request information to the NVM array module 210. The NVM controller module 220 may have a plurality of modules that handle various access types, respectively. For example, a reset control module can implement a reset sequence (reset requests), a read control module can handle read access requests (read requests), an erase control module can handle erase access requests (erase requests), and a program control module can handle program access requests (program requests). In another embodiment, the NVM controller 220 can be one module that handles all types of NVM array accesses.

Figure 2:
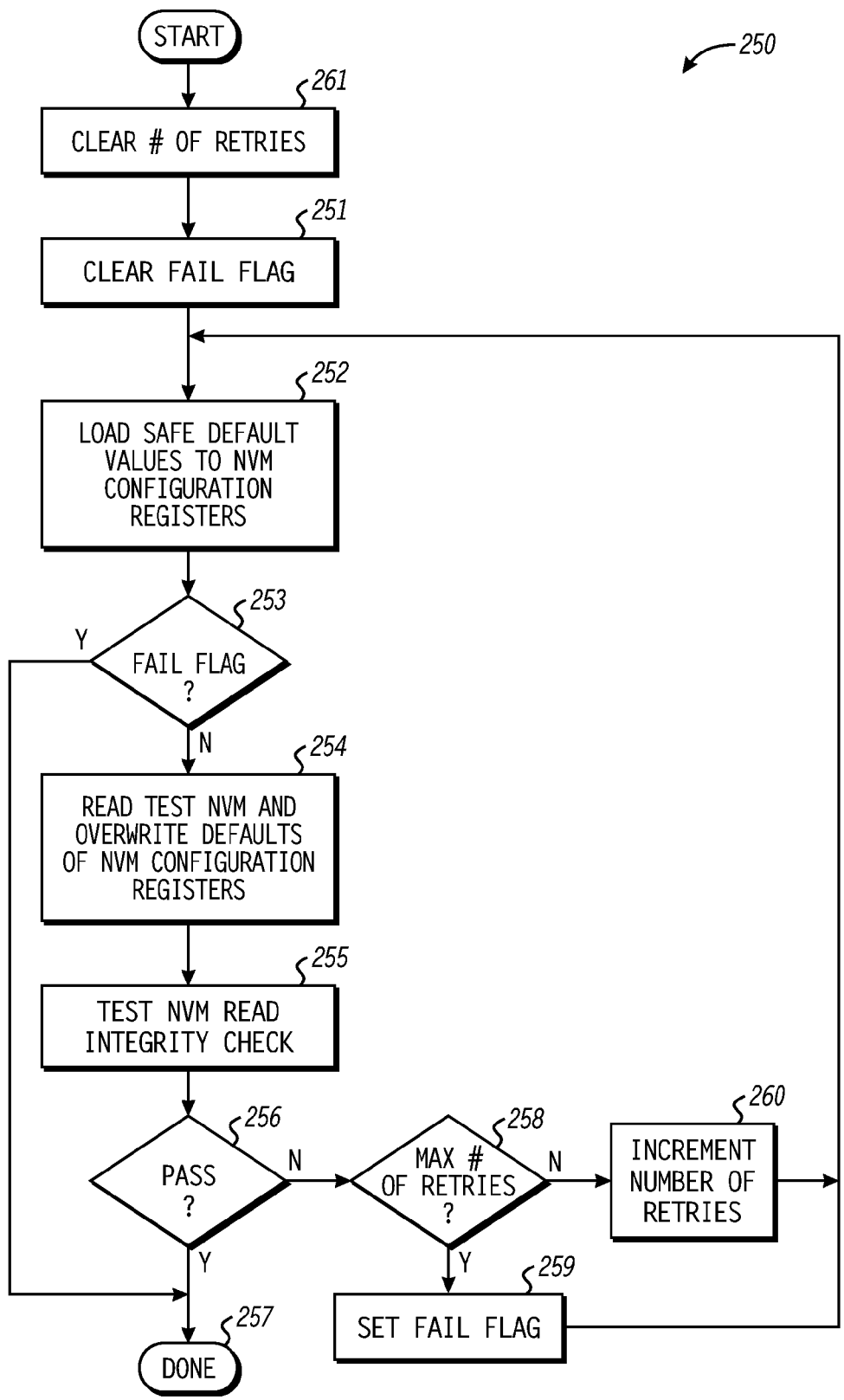
FIG. 2 illustrates, in flowchart form, a method 250 in accordance with at least one embodiment.

FIG. 2 illustrates, in flowchart form, a method 250 of an NVM reset sequence in accordance with at least one embodiment. In block 261, a number of retries counter 226 is cleared. The number of retries counter 226 may be explicitly cleared initially by performing a step of clearing the number of retries counter 226, but, if logic devices 222 used to implement the number of retries counter 226 are configured to assure that the number of retries counter 226 is automatically cleared upon reset, an explicit step of clearing the number of retries counter 226 need not be performed. For example, a step of clearing the number of retries counter 226 may be performed in hardware logic 222 or in firmware 222 (e.g., a program step in firmware to clear the number of retries counter). From block 261, the method continues to block 251. In block 251, a fail flag 225 is cleared. The fail flag 225 may be explicitly cleared initially by performing a step of clearing the fail flag 225, but, if logic devices used to implement the fail flag 225 are configured to assure that the fail flag 225 is automatically cleared upon reset, an explicit step of clearing the fail flag 225 need not be performed. For example, a step of clearing the fail flag 225 may be performed in hardware logic 222 or in firmware 222 (e.g., a program step in firmware to clear the fail flag). From block 251, the method continues to block 252.

At block 252, safe default values 221 are loaded to NVM configuration registers 223, and flow proceeds to block 253. In block 253, the fail flag 225 is checked and a decision is made whether the fail flag 225 is set. If the fail flag 225 is set, the process continues to block 257, where the process ends with the safe default values 221 loaded to the NVM configuration registers 223. If the fail flag 225 is not set, the process continues from block 253 to block 254. In block 254, configuration values 213 are read from the Test NVM memory 211 and stored to the NVM configuration registers 223, thereby overwriting the safe default values 221. From block 254, the process continues to block 255. At block 255, a Test NVM read integrity check is performed. From block 255, the process continues to block 256. In block 256, a decision is made as to whether or not the memory device 200 has passed the Test NVM read integrity check. If so, the process continues to block 257, where the process ends with the configuration values 213 that were read from the Test NVM memory 211; thus, allowing the NVM 200 to operate with enhanced performance. If not, the process continues to block 258, where a decision is made as to whether a maximum number of retries has been performed. If so, the process continues to block 259, where the fail flag 225 is set, then the process returns to block 252. If not, the process continues to block 260, where the number of retries counter 226 is incremented. From block 260, the process returns to block 252 without setting the fail flag 225.

Thus, if the test read integrity check 255 can be passed after reading Test NVM 211 and overwriting defaults of NVM configuration registers 254 within a maximum number of retries 226 at block 258, the process will end in block 257 with the NVM configuration registers 223 containing enhanced configuration values 213 read from Test NVM 211, and the NVM device 200 will be operational. However, if the test read integrity check 255 cannot be passed after reading Test NVM 211 and overwriting defaults of NVM configuration registers 254 within a maximum number of retries 226 at block 258, the process will end in block 257 with the NVM configuration registers 223 containing safe default values 221, wherein the availability of the safe default values 221 is independent of the ability (e.g., inability) to read enhanced configuration values 213 from the Test NVM 211, and the NVM device 200 will be operational. Accordingly, when the process ends in block 257, the NVM device 200 will be operational regardless of whether or not it was possible to accurately read enhanced configuration values 213 from Test NVM 211 in block 254 during any of the iterations over which the process was performed.

While the method 250 is illustrated as setting a fail flag 225 in block 259 after a maximum number of retries 226 is found to have occurred in decision block 258, then again loading safe default values 221 to NVM configuration registers 223 in block 252, testing the fail flag 225 in decision block 253, and proceeding to the end of the method in block 257, as the fail flag 225 was set in block 259, it should be understood that such method may also be practiced in accordance with at least one other embodiment. For example, the method may be implemented such that satisfying the maximum number of retries test in decision block 258 leads to performing a separately instantiated step of loading the safe default values 221 to the NVM configuration registers 223, similar to, but separate from, block 252. Such separately instantiated step of loading the safe default values 221 to the NVM configuration registers 223 may then lead directly to the end of the method in block 257, avoiding the need for setting a fail flag 225 in block 259 and testing the fail flag 225 in decision block 253. However, as noted in further detail below, the use of a fail flag 225 can provide a useful indication of the outcome of a reset sequence, in accordance with at least one embodiment, so setting a fail flag 225 in block 259 may be preferred under some circumstances. Other embodiments of the method 250, as may be beneficially practiced under various circumstances, can be understood in view of the foregoing exemplary embodiments.

An NVM reset sequence may be performed as a power-up reset sequence and/or as a subsequent reset sequence (i.e., after the NVM device has already been powered up and made operational) (e.g., to wake up from a sleep mode). For example, the NVM controller 220 (or a higher level system component, such as a general purpose processor) could assert reset as additional failsafe during operation of the NVM device 200. As another example, a user could assert reset as desired.

In accordance with at least one embodiment, safe default values may be established for all NVM devices of a given original equipment manufacturer (OEM) technology. Thus, a NVM controller for use with NVM devices of that given OEM technology can ensure proper operation of all NVM devices of such given OEM technology. In accordance with at least one embodiment, selective metallization may be used to pick between several values (e.g., parts within a given OEM technology), allowing a single NVM controller design to be fabricated differently to use different safe default values for different parts.

In accordance with at least one embodiment, safe default values are stored in an NVM controller. In accordance with at least one embodiment, enhanced configuration values are stored in a NVM array. In accordance with at least one embodiment, the NVM configuration registers are located in a NVM controller. In accordance with at least one embodiment, read integrity check information is located in the NVM array and also in the NVM controller. The read integrity check information stored in NVM array need not be the same as the read integrity check information stored in the NVM controller, if one can be derived from the other (e.g., by calculating a checksum, performing a logical operation, performing an arithmetic operation, etc.) In accordance with at least one embodiment, the fail flag is located in a NVM controller. The fail flag is an indicator of a possible error during the reset sequence and the NVM device is operating based upon the safe default values. It is up to the users to determine how to re-act if the fail flag is set after the reset sequence completes, e.g., checking for possible cause of the error and/or restarting another NVM reset. In accordance with at least one embodiment, the enhanced configuration values are read to the NVM configuration registers. In accordance with at least one embodiment, the read integrity check information stored in the NVM array is read once to perform a read integrity check, although at least one embodiment may read the read integrity check information stored in the NVM array a different number of times (or may read different elements of the read integrity check information) to perform a read integrity check.

In accordance with at least one embodiment, if the Test NVM read integrity check is not passed on the first attempt, one or two retries are attempted before reverting to the safe default configuration values and exiting the reset process. However, other embodiments may be implemented with other maximum numbers of retries.

Before the method begins, a voltage stabilization process may be performed. For example, a fixed delay may be introduced to allow voltages to stabilize before beginning the method. Upon completion of the method, a "done" bit may be set (e.g., a "done" bit may be set in a register in the NVM controller 220).

In accordance with at least one embodiment, a method for initializing a non-volatile memory (NVM) device comprises loading safe default values to NVM configuration registers, obtaining enhanced configuration values pertaining to the NVM device (which, as one example, may further comprise reading enhanced configuration values from a first set of Test NVM memory locations of the NVM device) and overwriting the safe default values of the NVM configuration registers, performing a Test NVM read integrity check on at least a portion of a second set of Test NVM memory locations, assuring that the NVM device will be operational regardless of whether the Test NVM read integrity check is passed, and, when the Test NVM read integrity check is passed, continuing a NVM reset sequence. In accordance with at least one embodiment, the method further comprises, when the Test NVM read integrity check is not passed, repeating the steps of loading the safe default values, reading the Test NVM and overwriting the safe default values, performing the Test NVM read integrity check up to a maximum number of retries. In accordance with at least one embodiment, the method further comprises, when the Test NVM read integrity check is not passed after the maximum number of retries, repeating the step of loading the safe default values, but not further repeating the steps of reading the Test NVM and overwriting the safe default values and performing the Test NVM integrity check.

In accordance with at least one embodiment, the performing the Test NVM read integrity check further comprises checking for the accurate reading of a particular data pattern from a particular location among the at least a portion of the second set of the Test NVM memory locations. For example, checking for a specific verifiable bit pattern may be performed, wherein verifiable is understood to mean that the apparatus performing the checking for the specific bit pattern has information sufficient for it to be able to determine whether the data pattern read from the at least the portion of the second set of the Test NVM memory locations is, indeed, the specific bit pattern stored in the at least the portion of the second set of the Test NVM memory locations. In accordance with at least one embodiment, the checking for the accurate reading of the particular data pattern further comprises checking for an alternating bit pattern. In accordance with at least one embodiment, the performing the Test NVM read integrity check further comprises checking for a correct checksum of the at least a portion of the second set of the Test NVM memory locations. In accordance with at least one embodiment, the performing the Test NVM read integrity check further comprises checking for a non-correctable error correcting code (ECC) error during reading of the Test NVM. In accordance with at least one embodiment, the method is implemented as a hardware state machine. In accordance with at least one embodiment, the method is implemented in firmware in a microprocessor. In accordance with at least one embodiment, the configuration values stored in the Test NVM are programmed during production test process. In accordance with at least one embodiment, a user cannot alter the Test NVM information. In accordance with at least one embodiment, a user can select a type of Test NVM read integrity check to be performed. In accordance with at least one embodiment, a user can select a number of retries.

In accordance with at least one embodiment, a non-volatile memory (NVM) controller comprises NVM configuration registers, a safe default value storage location where safe default values are stored, and a processor, the processor responsive to a reset condition, wherein, upon a reset condition. The processor executes a process comprising copying the safe default values from the safe default value storage location to the NVM configuration registers, reading enhanced configuration values from at least a portion of a first set of Test NVM to the safe default value storage location, performing a Test NVM read integrity check, when failing the Test NVM read integrity check, reiterating the process up to a maximum number of retries, and, when passing the Test NVM read integrity check, concluding the process, allowing normal operation of the NVM. In accordance with at least one embodiment, the NVM controller of claim 0 further comprises, when reaching the maximum number of retries, concluding the process, allowing the normal operation of the NVM after performing the step of copying the safe default values from the safe default value storage location to the NVM configuration registers. In accordance with at least one embodiment, the performing the Test NVM read integrity check comprises checking for accurate reading of a particular data pattern from memory.

In accordance with at least one embodiment, a method for initializing a non-volatile memory (NVM) device comprises copying safe default values from a safe default value storage location to NVM configuration registers, reading enhanced configuration values from at least a portion of a first set of Test NVM to the safe default value storage location, performing a Test NVM read integrity check; when failing the Test NVM read integrity check, reiterating the process up to a maximum number of retries; when passing the Test NVM read integrity check, concluding the process, allowing normal operation of the NVM; and, when reaching the maximum number of retries, concluding the process, allowing the normal operation of the NVM. In accordance with at least one embodiment, the NVM configuration registers are loaded with the safe default values when the step of, when reaching the maximum number of retries, concluding the process, allowing the normal operation of the NVM, is performed. In accordance with at least one embodiment, the performing the Test NVM read integrity check comprises checking for accurate reading of a particular data pattern from memory. In accordance with at least one embodiment, the enhanced configuration values are stored in the at least the portion of the first set of Test NVM during a production test process.

What is claimed is:
1. A method for initializing a non-volatile memory (NVM) device comprising:
  obtaining enhanced configuration values pertaining to the NVM device;
  configuring the NVM device to operate based upon the enhanced configuration values;

subsequent to configuring based upon the enhanced configuration values, performing a Test NVM read integrity check on at least a portion of a second set of Test NVM memory locations; and in response to the Test NVM read integrity check being passed, continuing a NVM reset sequence, otherwise in response to the NVM read integrity check not being passed configuring the NVM device to operate based upon the safe default values stored at NVM configuration registers.

2. The method of claim 1 wherein in response to the NVM read integrity check not being passed further comprises:
repeating the following up to a maximum number of times:
reading the enhanced configuration values from the first set of Test NVM memory locations;
configuring the NVM device to operate based upon the read enhanced configuration values; and
subsequent to configuring based upon the enhanced configuration values, performing the Test NVM read integrity check on at least the portion of the second set of Test NVM memory locations.

3. The method of claim 2 further comprising:
in response to the Test NVM read integrity check not being passed after the maximum number of retries, repeating configuring the NVM device to operate based upon the safe default values stored at NVM configuration registers, but not further repeating reading the enhanced configuration values, configuring the NVM device to operate based upon the read enhanced configuration values, and performing the Test NVM read integrity check.

4. The method of claim 2 further comprising:
in response to the Test NVM read integrity check not being passed after the maximum number of retries, setting a fail flag and operating the NVM device based upon the safe default values.

5. The method of claim 1 wherein the performing the Test NVM read integrity check further comprises:
checking for the accurate reading of a particular data pattern from a particular location among the at least a portion of the second set of the Test NVM memory locations.

6. The method of claim 5 wherein the checking for the accurate reading of the particular data pattern further comprises:
checking for a specific verifiable bit pattern.

7. The method of claim 1 wherein the performing the Test NVM read integrity check further comprises:
checking for a correct checksum of the at least a portion of the second set of the Test NVM memory locations.

8. The method of claim 1 wherein the performing the Test NVM read integrity check further comprises:
checking for a non-correctable error correcting code (ECC) error during reading of the Test NVM.

9. The method of claim 1 wherein the method is implemented as a hardware state machine.

10. The method of claim 1 wherein the method is implemented in firmware in a microprocessor.

11. The method of claim 1 wherein the configuration values stored in the Test NVM are determined and programmed during a production test process.

12. The method of claim 1 wherein a user cannot alter the Test NVM information.

13. The method of claim 1 wherein the NVM device can select a type of Test NVM read integrity check to be performed.

14. The method of claim 1 wherein the NVM device can select a number of retries.

15. A non-volatile memory (NVM) controller comprising:
NVM configuration registers;
a safe default value storage location where safe default values are stored; and
a processor, the processor responsive to a reset condition, wherein, upon a reset condition, the processor to:
copy the safe default values from the safe default value storage location to the NVM configuration registers;
copy enhanced configuration values from at least a portion of a first set of Test NVM to the NVM configuration registers
perform a Test NVM read integrity check subsequent to copying the configuration values, and
in response to failing the Test NVM read integrity check, reiterating the copies and performance of the Test NVM read integrity check, up to a maximum number of retries, otherwise, in response to passing the Test NVM read integrity check, the processor to continue with a reset process.

16. The NVM controller of claim 15 further comprising:
when reaching the maximum number of retries, the processor to copy the safe default values from the safe default value storage location to the NVM configuration registers; and allow the normal operation of the NVM based upon the safe default values.

17. The NVM controller of claim 15 wherein the processor is to perform the Test NVM read integrity check by checking for an accurate read of a particular data pattern from memory.

18. A method for initializing a non-volatile memory (NVM) device comprising:
copying safe default values from a safe default value storage location to NVM configuration registers;
reading enhanced configuration values from at least a portion of a first set of Test NVM to the safe default value storage location;
performing a Test NVM read integrity check;
in response to failing the Test NVM read integrity check, reiterating the process up to a maximum number of retries, otherwise, in response to passing the Test NVM read integrity check, concluding the process to allow normal operation of the NVM based upon the enhanced configuration values; and
wherein upon reaching the maximum number of retries, concluding the process to allowing normal operation of the NVM based upon the safe default values.

19. The method of claim 18 wherein the performing the Test NVM read integrity check comprises:
checking for accurate reading of a particular data pattern from memory.

20. The method of claim 19 wherein the enhanced configuration values are determined and stored in the at least a portion of the first set of Test NVM during a production test process.

* * * * *